(12) United States Patent (10) Patent No.: US 7,428,105 B2
Shafer et al. (45) Date of Patent: Sep. 23, 2008

(54) OBJECTIVES AS A MICROLITHOGRAPHY PROJECTION OBJECTIVE WITH AT LEAST ONE LIQUID LENS

(75) Inventors: David R. Shafer, Fairfield, CO (US); Susanne Beder, Aalen (DE); Karl-Heinz Schuster, Koenigsbronn (DE); Wolfgang Singer, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 11/758,363

(22) Filed: Jun. 5, 2007

(65) Prior Publication Data
US 2008/0030869 A1 Feb. 7, 2008

Related U.S. Application Data

(63) Continuation of application No. 10/562,257, filed as application No. PCT/EP2004/014219 on Dec. 14, 2004, now Pat. No. 7,385,764.

(60) Provisional application No. 60/544,967, filed on Feb. 13, 2004, provisional application No. 60/568,006, filed on May 4, 2004, provisional application No. 60/591,775, filed on Jul. 27, 2004, provisional application No. 60/592,208, filed on Jul. 29, 2004, provisional application No. 60/612,823, filed on Sep. 24, 2004, provisional application No. 60/530,623, filed on Dec. 19, 2003.

(51) Int. Cl.
*G02B 9/00* (2006.01)
*G02B 1/06* (2006.01)

(52) U.S. Cl. ....................... 359/649; 359/665

(58) Field of Classification Search ......... 359/649–651, 359/656–661, 665
See application file for complete search history.

(56) References Cited

U.S. PATENT DOCUMENTS 4,346,164 A 8/1982 Tabarelli et al.

(Continued)

FOREIGN PATENT DOCUMENTS

DE 221563 4/1985

(Continued)

OTHER PUBLICATIONS

Lammers, "'Doped water' could extend 193-nm immersion litho," *EETimes Online*, http://ww.eetimes.com/showArticle.jhtml?articleID=18310517, 2 pages (Jan. 28, 2004).

(Continued)

*Primary Examiner*—William C Choi
(74) *Attorney, Agent, or Firm*—Fish & Richardson P.C.

(57) ABSTRACT

The invention relates to an objective designed as a microlithography projection objective for an operating wavelength. The objective has a greatest adjustable image-side numerical aperture NA, at least one first lens made from a solid transparent body, in particular glass or crystal, with a refractive index $n_L$ and at least one liquid lens (F) made from a transparent liquid, with a refractive index $n_F$. At the operating wavelength the first lens has the greatest refractive index $n_L$ of all solid lenses of the objective, the refractive index $n_F$ of the at least one liquid lens (F) is bigger than the refractive index $n_L$ of the first lens and the value of the numerical aperture NA is bigger than 1.

26 Claims, 3 Drawing Sheets

U.S. PATENT DOCUMENTS

| | | | |
|---|---|---|---|
| 4,890,903 A | 1/1990 | Treisman et al. | |
| 5,446,591 A | 8/1995 | Medlock | |
| 5,627,674 A | 5/1997 | Robb | |
| 5,682,263 A | 10/1997 | Robb et al. | |
| 6,169,627 B1 | 1/2001 | Schuster | |
| 6,181,485 B1 | 1/2001 | He | |
| 6,496,306 B1 | 12/2002 | Shafer et al. | |
| 6,809,794 B1 | 10/2004 | Sewell | |
| 7,187,503 B2 | 3/2007 | Rostalski et al. | |
| 7,362,508 B2 * | 4/2008 | Omura et al. | 359/649 |
| 2002/0163629 A1 | 11/2002 | Switkes et al. | |
| 2002/0196533 A1 | 12/2002 | Shafer et al. | |
| 2003/0174408 A1 | 9/2003 | Rostalski et al. | |
| 2003/0224528 A1 | 12/2003 | Chiou et al. | |
| 2004/0105170 A1 | 6/2004 | Krahmer et al. | |
| 2004/0109237 A1 | 6/2004 | Epple et al. | |
| 2004/0125351 A1 | 7/2004 | Krautschik | |
| 2005/0024609 A1 | 2/2005 | De Smit et al. | |
| 2005/0068499 A1 | 3/2005 | Docdoc et al. | |
| 2005/0074704 A1 | 4/2005 | Endo et al. | |
| 2005/0117224 A1 | 6/2005 | Shafer et al. | |
| 2005/0161644 A1 | 7/2005 | Zhang et al. | |
| 2005/0179877 A1 | 8/2005 | Mulkens et al. | |
| 2005/0190435 A1 | 9/2005 | Shafer et al. | |
| 2005/0190455 A1 | 9/2005 | Rostalski et al. | |
| 2005/0219707 A1 | 10/2005 | Schuster et al. | |
| 2005/0225737 A1 | 10/2005 | Weissenrieder et al. | |
| 2005/0248856 A1 | 11/2005 | Omura et al. | |
| 2006/0012885 A1 | 1/2006 | Beder et al. | |
| 2006/0066962 A1 | 3/2006 | Totzeck et al. | |
| 2006/0187430 A1 | 8/2006 | Docdoc et al. | |
| 2006/0221456 A1 | 10/2006 | Shafer et al. | |
| 2006/0221582 A1 | 10/2006 | DeNies et al. | |
| 2006/0244938 A1 | 11/2006 | Schuster | |
| 2007/0052936 A1 | 3/2007 | Philips | |
| 2007/0091451 A1 | 4/2007 | Schuster | |
| 2007/0109659 A1 | 5/2007 | Rostalski et al. | |
| 2007/0165198 A1 | 7/2007 | Kneer et al. | |

FOREIGN PATENT DOCUMENTS

| | | |
|---|---|---|
| DE | 224448 | 7/1985 |
| EP | 0023231 | 2/1981 |
| EP | 0291596 B1 | 1/1994 |
| EP | 1420302 | 5/2004 |
| EP | 1 491 956 | 12/2004 |
| EP | 1486827 | 12/2004 |
| EP | 1522894 | 4/2005 |
| EP | 1524558 | 4/2005 |
| JP | 07220990 | 8/1995 |
| JP | 10-228661 | 8/1998 |
| JP | 10-303114 | 11/1998 |
| JP | 2000-58436 | 2/2000 |
| WO | WO 01/50171 | 7/2001 |
| WO | WO 02/093209 | 11/2002 |
| WO | WO2004/019128 | 3/2004 |
| WO | WO 2004/019128 | 3/2004 |
| WO | WO 2004/057589 | 7/2004 |
| WO | WO 2004/107048 | 12/2004 |
| WO | WO 2005/006026 | 1/2005 |
| WO | WO2005/006026 | 1/2005 |
| WO | WO 2005/031823 | 4/2005 |
| WO | WO2005/031823 | 4/2005 |
| WO | WO 2005/059617 | 6/2005 |
| WO | WO2005/059618 | 6/2005 |
| WO | WO 2005/059618 | 6/2005 |
| WO | WO2005/059645 | 6/2005 |
| WO | WO 2005/059645 | 6/2005 |
| WO | WO 2005/081067 | 9/2005 |
| WO | WO2005/081067 | 9/2005 |
| WO | WO 2006/045748 | 5/2006 |

OTHER PUBLICATIONS

Saurei et al., "Design of an autofocus lens for VGA ¼-inch CCD and CMOS sensors," *SPIE International Symposium: Optical Systems Design*, St. Etienne, France, 1 page (2003).

J.A. Hoffnagle et al., "Liquid Immersion Deep-Ultraviolet Interferometric Lithography", Journal of Vacuum Science &: Technology B:Microelectronics Processing and Phenomena, American Vacuum Society, New York, NY, vol. 17, No. 6, Nov. 1999 (199-11) pp. 3306-3309.

Smith, Bruce, "Water-based 193nm Immersion Lithography", Online!, http://www.sematech.org/resources/litho/meetings/immersion/20040128/presentations/06%20rit20$microstepper%20effortsSmith.pdf. , (Jan. 28, 2004).

Hoffnagle, J.A. et al. "Liquid immersion deep-ultraviolet interferometric lithography", Journal of Vacuum Science & Technology B: Microelectronics Processing and Phenomena, American Vacuum Society, New York, NY, US, vol. 17, No. 6, Nov. 1999, pp. 3306-3309.

Smith, et al. "Water-based 193nm immersion lithography", online, Jan. 28, 2004, retrieved from the internet: URL:http://www.sematech.org/resources/litho/meetings/immersion/20040128/presentations/06%2ORIT%20microstepper%20efforts_Smith.pdf, retrieved on May 24, 2005.

* cited by examiner

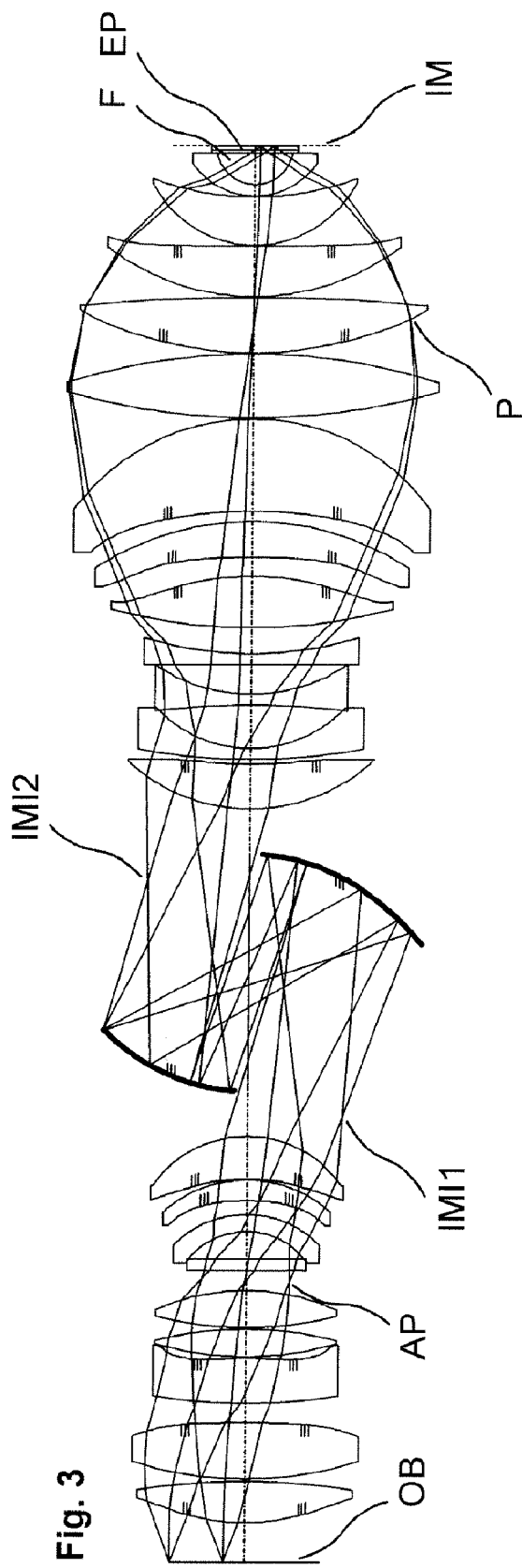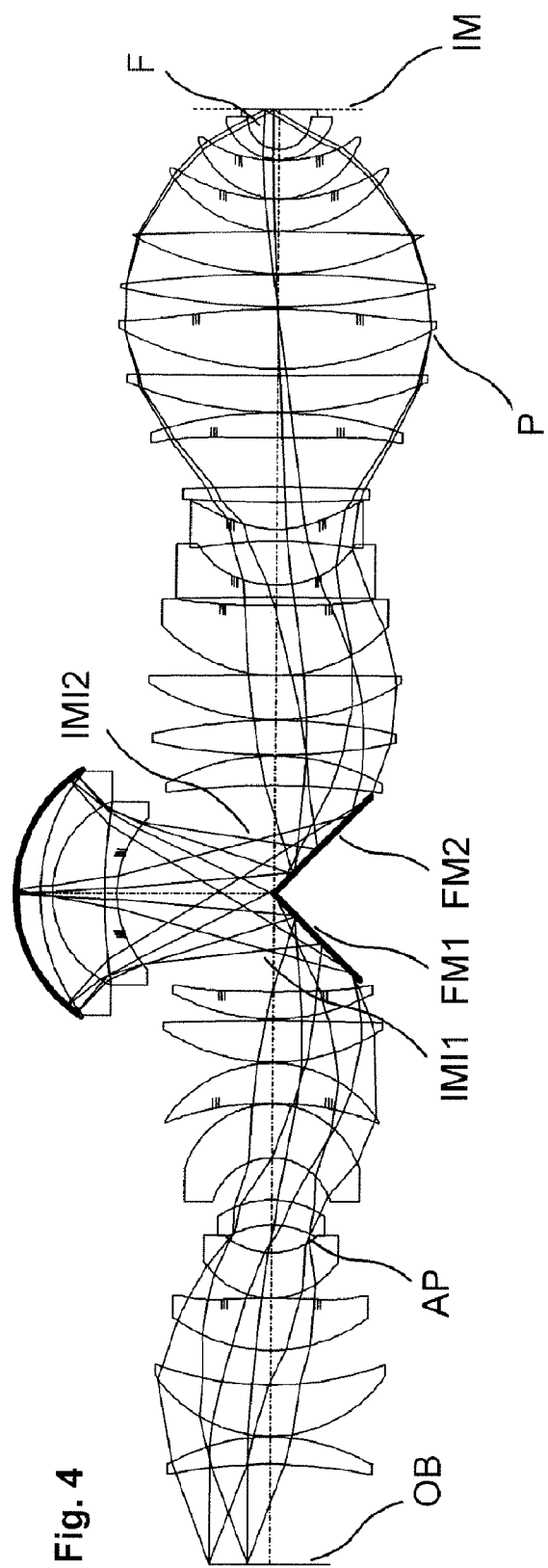

OBJECTIVES AS A MICROLITHOGRAPHY PROJECTION OBJECTIVE WITH AT LEAST ONE LIQUID LENS

BACKGROUND OF THE INVENTION

1. Field of the Invention

This application is a continuation and claims the benefit of priority under 35 U.S.C. § 120 of U.S. application Ser. No. 10/562,257, filed Dec. 21, 2005, which is a National Phase application filed under 35 U.S.C. § 371, from PCT Application No. PCT/EP2004/014219, filed Dec. 14, 2004, which claims the benefit of priority to: U.S. Ser. No. 60/530,623, filed Dec. 19, 2003; U.S. Ser. No. 60/544,967 filed Feb. 13, 2004; U.S. Ser. No. 60/568,006 filed May 4, 2004; U.S. Ser. No. 60/591,775 filed Jul. 27, 2004; U.S. Ser. No. 60/592,208 filed Jul. 29, 2004; and U.S. Ser. No. 60/612,823 filed Sep. 24, 2004. These applications are incorporated herein by reference in their entirety.

The invention relates to an objective designed as a microlithography projection objective. The objective according to the invention comprises at least one liquid lens made from a transparent liquid.

2. Description of the Related Art

Microlithography projection objectives of multivarious design are known.

In all imaging systems, the smallest resolvable structural width is proportional to the numerical aperture NA at the image plane.

This, in turn, is proportional to the angle of incidence and the refractive index $n_I$ of the medium through which the light falls onto the image plane.

By contrast with so-called dry objectives with gas (air, $N_2$, He and the like) or a vacuum with a refractive index of approximately 1.0, a material, in particular a liquid, with a substantially higher refractive index is used as this medium in immersion systems.

For example, as far as is known for the wavelength 193 nm water has a refractive index $n_{H2O}$=1.44.

High-index lenses with a refractive index much higher than 1.6 have been used in microlithography at wavelengths of greater than 365 nm, but they become incapable of use at the wavelengths of practical relevance such as 248 nm, 195 nm, 157 nm, since they are not sufficiently transparent, and so on. Lenses made from sapphire have a high refractive index but are birefringent, and this must be compensated in a complicated way and with limited success.

SUMMARY OF THE INVENTION

The inventors have recognized that, furthermore, the possible image-side numerical aperture NA is limited by the refractive index of the curved optical element next to the image plane.

Such an element can be provided as a liquid lens that can also serve simultaneously as immersion liquid, specifically with or without a plane-parallel separation plate. However, if the refractive index $n_F$ thereof lags behind the refractive index $n_L$ of the solid lenses used in the objective, the achievable NA remains still smaller, NA<$n_F$.

The difference is significant in the case of a 193 nm objective with lenses made from fused silica with $n_L$=1.56 and with water as an immersion and a liquid lens with $n_F$=1.44.

According to the invention, use is made in the objective of at least one liquid lens whose refractive index $n_F$ is greater than the refractive index $n_L$ of each solid lens in the objective. The first lens in the meaning of claim 1 is the lens, arranged at any desired location in the objective, made from the highest-index solid lens material which is used in the objective. As also in the embodiments shown, all the lenses—except for the liquid lens or lenses—consist in many cases of the same solid material.

With respect to lenses made from fused silica or calcium fluoride, which are established for microlithography projection objectives with the operating wavelengths of 248 nm, 193 nm, 157 nm, liquids with, for example, $n_F$=1.6, $n_F$=1.65 or $n_F$=1.8 are suitable.

There is a corresponding result for other lens materials known for the deep UV (DUV) and vacuum UV, such as fluoride crystals $BaF_2$, $SrF_2$, LiF, NaF and others.

Although there are many developments of immersion liquids for applications in microlithography, it is clear at least in principle that $H_2SO_4$ (sulfuric acid), $H_3PO_4$ (phosphoric acid) and their solutions in $H_2O$ (water) yield adjustable refractive indices of 1.5-1.8 at 193 nm in conjunction with suitable transmission. In addition, the corrosive action of these substances is substantially reduced with the aid of substitution of heavy isotopes, in particular deuterium. This is described inter alia in U.S. Application Ser. No. 60/568,006.

Corrosion protection layers can be provided on the solid optical elements. This is disclosed inter alia in U.S. Application Ser. No. 60/530,623.

Accordingly, an objective having the features of claim 1 has surprisingly been found to be particularly advantageous. A microlithography projection objective with an image-side numerical aperture NA greater than 1, which is not accessible for a dry objective, is substantially relieved and extended as regards the possibilities for its optical design and correction when use is made of a liquid lens with a refractive index greater than the refractive index of the solid lenses. In the case of lenses made from different materials, the largest refractive index of all these lenses is exceeded. A plane-parallel plate, in particular an end plate made from sapphire, for example, may have a higher refractive index, in this case.

Objectives are usually corrected for specific operating wavelengths and can be operated reasonably only at these wavelengths. The refractive indices of all materials vary with wavelength, and it is always the values for the operating wavelength which are used as a basis here. Other wavelengths can traverse the objective, for example for the purposes of measurement.

It has surprisingly been found that on the basis of the invention it is possible to design objectives with an NA greater than the refractive index $n_L$ of every solid lens. This is also reflected in claim 2.

The liquid lens can be an immersion at the same time, that is to say it can be in contact to the object to be exposed. Alternatively, it is possible for an optical element made from a solid transparent body, in particular an end plate, to be arranged there between.

The liquids of the liquid lens and of the immersion at the object can then be adapted to various conditions such as:

in the case of the immersion:
  rapid movement for step-and-scan
  contact with materials of the wafer such as resist
  contact with air
  cleaning requirements for wafer processing after exposure in the case of the liquid lens:
  contact with material of the adjacent solid lens and be selected, accordingly.

Since the refractive indices $n_F$ of the liquid lens and $n_I$ of the immersion are lower bounds for the achievable NA, it is natural to prefer that $n_F$=$n_I$.

The effect of increasing the accessible NA caused by the liquid lens with high refractive index $n_F$ becomes greatest when said lens is the last curved element on the image side.

Substantially hemispherical last lenses have proved in this case to be advantageous, since then the angle of incidence of the light varies relatively slightly over the lens surface and remains close to the normal to the curved surface. The critical angle of total reflection is thus effectively avoided.

Intermediate images in the objective are a measure by which the lens diameters can be kept small. The availability and the price of lens material and of finish-machined lenses in a quality suitable for microlithography projection objectives are very substantially relieved at lower diameters.

It is therefore to be pointed out that, otherwise than in the US classification 359/642 defined for LENS, here it is precisely also optical systems with an intermediate image, even several thereof, that are designated as an objective. Designs of objectives suitable for the invention are inter alia disclosed in U.S. Application Ser. No. 60/544,967, U.S. Application Ser. No. 60/592,208 and U.S. Application Ser. No. 60/591,775.

The field flattening is a central problem with such an objective, being equivalent to a minimization of the Petzval sum.

Primarily for this purpose, but also for color correction (achromatization), a design as a catadioptric system comprising at least one curved mirror in addition to the lenses is advantageous. A combination of a negative lens and a concave mirror is particularly effective for color correction. Further possibilities for color correction are disclosed in U.S. Application Ser. No. 60/530,978. Catadioptric systems frequently have folding mirrors, thereby permitting the light beams running to a mirror to be separated from those returning therefrom. Such systems are also described and covered here.

However, all surfaces of the optical system are effective for correction when all mirrors are curved. This is possible, in particular, with an even number, especially 2, of curved mirrors. It is also possible in this case for the entire objective to be constructed along a common axis of symmetry in relation to which all the mirror and lens surfaces exhibit a rotationally symmetrical shape where light passes through. However, there is asymmetric edging in the region of the mirrors and, if appropriate, adjacent lenses. Adjustment and vibration resistance as well as installation space requirements of the objective profit from the common axis of symmetry.

It is favorable in this case if the objective comprises an image-side objective part arranged at the image-side end of the objective and an intermediate objective part preceding the image-side objective part with respect of the direction of the light moving from the object-side end to the image-side end of the objective. If not defined otherwise, this direction is the reference whenever a position of a component of the objective is defined. The intermediate objective part is containing mirrors and may be designed catoptrically as, for example, in FIG. 1-FIG. 3, or catadioptrically as in the other embodiments. The image-side objective part, which is purely refractive, is providing the extreme aperture and comprises the liquid lens.

It did surprisingly turn out that this image side objective part advantageously has its pupil in the region of the beam path which is convergent in relation to the image plane, or, as described in claim 11, that said pupil is located between the lens of the greatest diameter used and the image plane.

In this region, the strong positive refractive power which is required in order to produce the large angles of incidence at the image plane in accordance with the high NA is expediently distributed over a plurality of positive meniscus lenses which are concave on the image side. Both chromatic aberrations and contributions to the Petzval sum are thereby reduced.

The inventors have established that the solid lens preceding the liquid lens according to the invention and defining the object-side surface of the liquid lens should be a meniscus lens whose center thickness (THICKNESS in accordance with the tables) is smaller than the difference of the radii of curvature (RADIUS) of the two lens surfaces. Such a meniscus lens having negative refractive power in the paraxial region makes a transition in part to an action of positive refractive power in the outer region where beams strike more steeply, that is from further outside, than the normal to the surface.

It is advantageous when the objective comprises an object-side objective part being arranged at the object-side end of the objective and producing an intermediate image on the object side of the intermediate objective part.

This permits, inter alia, greater freedom in configuring the passage of the light bundles next to the mirrors, and yields an additional diaphragm location which can well be situated in an air space and is therefore well suited as a stop-down aperture diaphragm.

It is to be seen in the embodiments that it is advantageous to provide lenses of low refractive power with a strongly modulated aspheric shape preceding this diaphragm plane and to provide a strongly curved meniscus lens subsequent to this diaphragm plane, the meniscus lens being concave on the diaphragm side.

It is clear that such high-aperture projection objectives for microlithography of very high resolution require intensive use of aspherics, since essential parameters for image correction are thereby provided.

Deliberate use is also made in the exemplary embodiments of very strong aspherics and those whose deviation from the spherical shape does not exhibit a monotonic profile over the distance from the optical axis.

As already mentioned, such aspherics are particularly advantageous in the object-side objective part.

It emerges in addition that in the image-side objective part some positive lenses yield particularly suitable arrangements of strong aspherics. These positive lenses are situated in the region of the steeply rising light bundle diameter between the negative lenses arranged near the intermediate image and the belly of the light bundle at the lens with the maximum of the diameter of the light bundle passing through.

The embodiments presented are partly of an experimental nature. However, to the person skilled in the art who compares these with similar design solutions known to him and derives modifications therefrom they yield clear-cut teachings from which he is able to modify designs of objectives.

The various designs of the individual embodiments make this clear, and can, of course, also be combined with one another and with other known designs in the meaning of the invention.

The exemplary embodiments are explained in more detail with the aid of the drawings, in which

BRIEF DESCRIPTION OF THE DRAWINGS

FIG. 1 to 6 respectively show a meridian section of an embodiment of an objective according to the invention.

DESCRIPTION OF THE PREFERRED EMBODIMENTS

Figure 1:
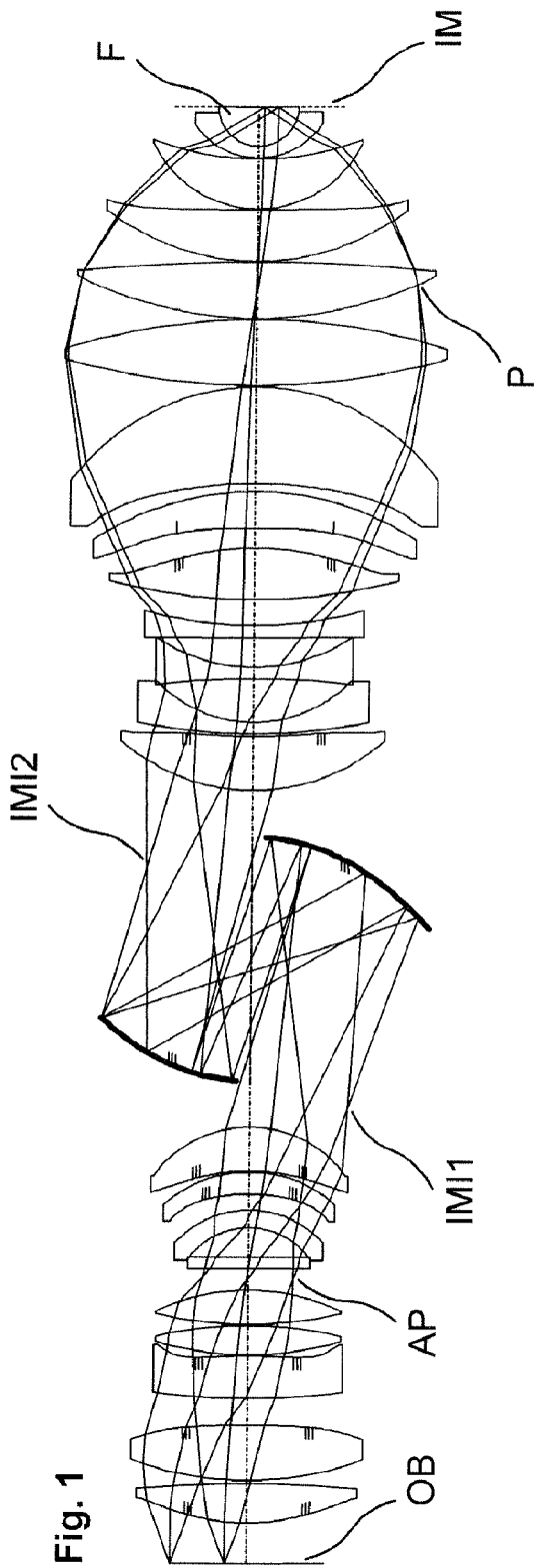

In FIG. 1 to 6 marginal and principal rays are depicted for the object points nearest and furthest from the axis. Aspheric surfaces are marked twice with 3 lines at the contour.

The optical axis or the axis of symmetry of the curvatures of the surfaces is marked by dots and dashes.

In each case OB denotes the object plane. This corresponds to the surface (SURF) 0 in the tables. IM denotes the image plane and corresponds in each case to the surface of the highest number in the tables.

F respectively denotes the liquid lens according to the invention.

EP denotes an optional end plate.

IMI1 and IMI2 are the intermediate images.

AP denotes the position of the system aperture at which an adjustable diaphragm can be arranged and will also be referred to as diaphragm plane.

P denotes the pupil in an image-side objective part.

All embodiments shown are designed for the operating wavelength 193.4 nm (ArF Excimer Laser) and reduce by 1:4—without limiting the invention thereto.

Tables 1a to 6a respectively give the design data for the drawing of the same number. Tables 1b to 6b respectively specify the aspheric data of the aspheric lens and mirror surfaces, which are identified in the drawings by three primes. The illustration is made using the Optik-Design-Software CODE V™ from Optical Research Associates and corresponds to their conventions.

In each embodiment shown in FIG. 1 to 6 the objective comprise an object-side objective part, an image-side objective part and an intermediate objective part. The object-side objective part is situated at the object-side end of the objective. The image-side objective part is situated at the image-side end of the objective. The intermediate objective part is situated between the object-side objective part and the image-side objective part. In the embodiments the object-side objective part and the image side objective part are purely reflective. The intermediate objective part is catoptric or catadioptric.

Figure 2:
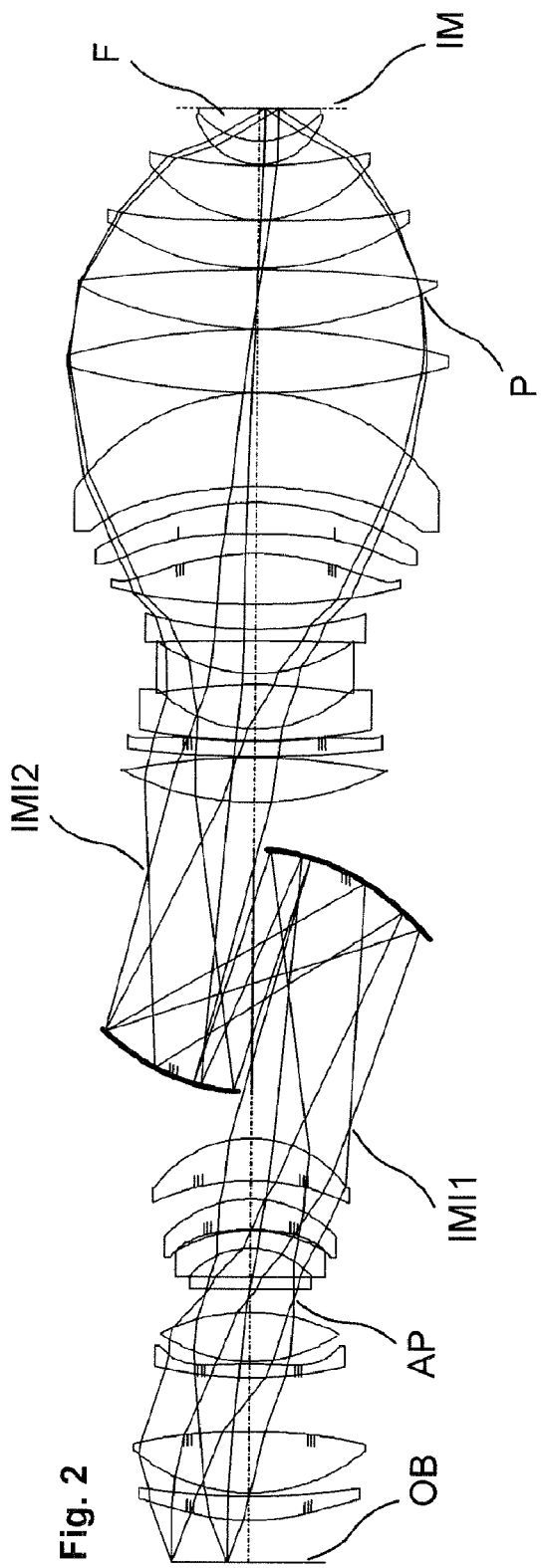

In the embodiments of FIG. 1 to FIG. 3 the value of the numerical aperture NA=1.4. The liquid of the lens F and the immersion have the same refractive index $n_F = n_I = 1.65$. The material of the solid lenses is fused silica with an index of refraction $n_L = 1.56$.

The distance from the object plane OB to the image IM is 1250 mm and thereby a common value.

The image field is 26 mm×5.5 mm, decentered by 4.66 mm. However, the correction state yields an RMS wave front error of this image field of approximately 10-20 per mil of the operating wavelength.

The lenses of the object-side objective part and the image side objective part are rotationally symmetrical in relation to a common axis of symmetry, with the two mirrors of the catoptric version of the intermediate objective part certainly being curved in an axially symmetrical fashion, but being edged asymmetrically.

The design of the objective will now be described in more detail with respect to the embodiment of FIG. 1. Most of the features are also present at the embodiments of FIG. 2 to 6, but will only be explained in some detail with respect to FIG. 1.

The object-side objective part comprises an accessible diaphragm plane AP with the stop-down system diaphragm. Preceding the diaphragm plane AP there is a particularly strongly modulated aspheric (surface 7 of table 1a/b). Subsequent to the diaphragm plane AP there is a meniscus lens which is concave on the side of the diaphragm plane AP (surfaces 15, 16 in table 1a).

The intermediate objective part is designed catoptrically and comprises two concave mirrors (surfaces 23, 24 in table 1a).

The image-side objective part subsequent to the second intermediate image IMI2—the intermediate images are not corrected and do not form an image plane—begins with a positive lens group of single-lens design, forms a waist with a number of negative lenses, and has a positive lens group with many members which forms a massive belly.

Strongly modulated aspherics (inter alia, surface 36 in table 1a/b) are significant in the initial region of the positive lens group where the diameter of the light bundle and of the lenses are increasing. The middle of the belly is formed by the lens of greatest diameter (surface 41/42 in table 1a/b, height (SEMIDIAM, half lens diameter) 160 mm). The production of lithographic projection objectives is very economical with this lens diameter. The pupil P of the image-side objective part is, in a fashion typical of the objectives according to the invention, following this largest lens in the convergent beam path.

In the embodiment of FIG. 1, the liquid lens F is formed between the surface 50 and the image plane IM (surface 52) and is at the same time the immersion. It is virtually hemispherical given the radius 34.6 mm and the thickness 30.1+3.0=33.1 mm. The ratio of radius to thickness is 1.05. The adjacent last fused silica lens is in this case a meniscus lens whose thickness of 10 mm is substantially smaller than the difference of the radii 66 mm-34 mm (surfaces 49/50).

In the embodiment of FIG. 2, once again the liquid lens F is at the same time likewise immersion. However, it is substantially flatter than the liquid lens F of FIG. 1. Only in combination with the last fused silica lens, the liquid lens F forms an approximately hemispherical member.

Using a rather flat liquid lens F makes the exchange of the liquid simpler.

It has been established that a plane-parallel plate which separates the liquid lens F and the immersion is not critical for the optical function. This holds in particular when the refractive index of the plan-parallel plate is greater than the refractive indices $n_F$ of the liquid lens F and $n_I$ of the immersion.

Starting from the embodiment of FIG. 1, FIG. 3 shows an embodiment with such an end plate EP of refractive index $n_{EP}=1.80$. By adapting the thickness, it can easily be exchanged for a plate made from sapphire with $n_{EP}=1.92$.

In the embodiment of FIG. 4 (table 4a/b) a catadioptric design is used for the intermediate objective part.

Given the same NA, $n_F$, $n_L$ as the preceding embodiments, the image field is somewhat deviant with 22×5.2 mm and greater decentering of 5.753 mm.

In this embodiment two planar folding mirrors FM1 (surface 21) and FM2 (surface 31) are used as geometric beam splitters. Provided in a lateral arrangement are a concave mirror—surface 26 in table 4a/b—and lenses of negative refractive power through which the light passes twice. The surfaces 22-25 of these lenses are thus present once more specularly as 27 to 30 in table 4a/b, since they refract the light twice.

The high-index liquid lens F is also advantageously used with this quite different approach to the design of the microlithographic projection objective. In a way similar to FIG. 1, it is designed here as "immersion lens", touching the object, between the surfaces 63 and 65.

Figure 5:
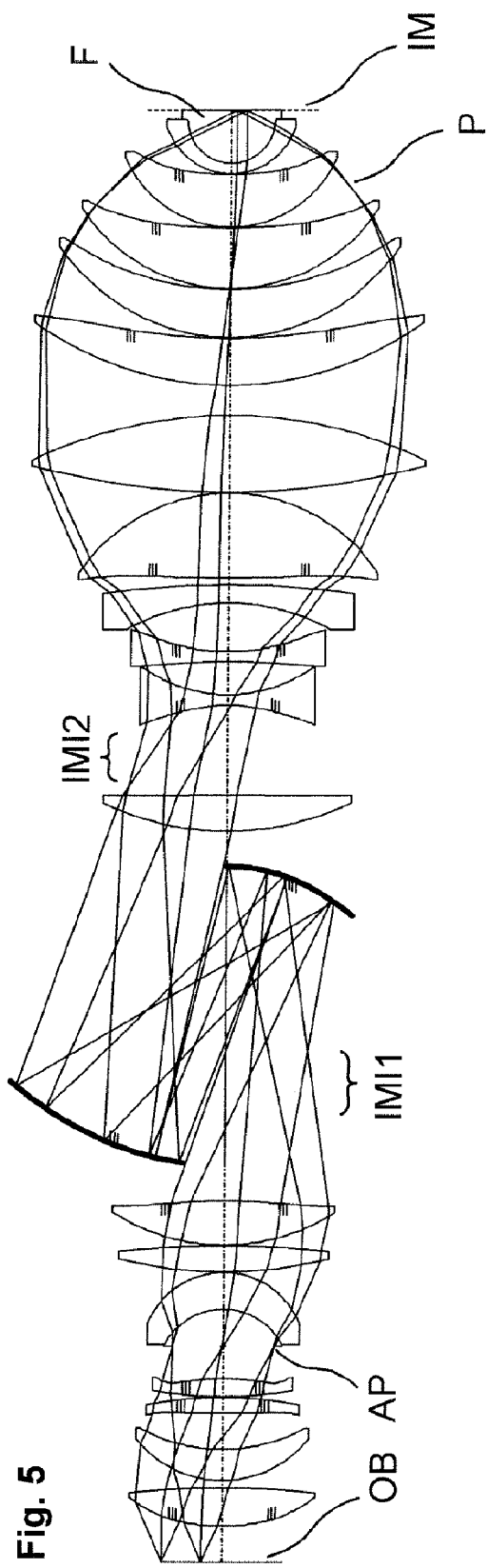
Figure 6:
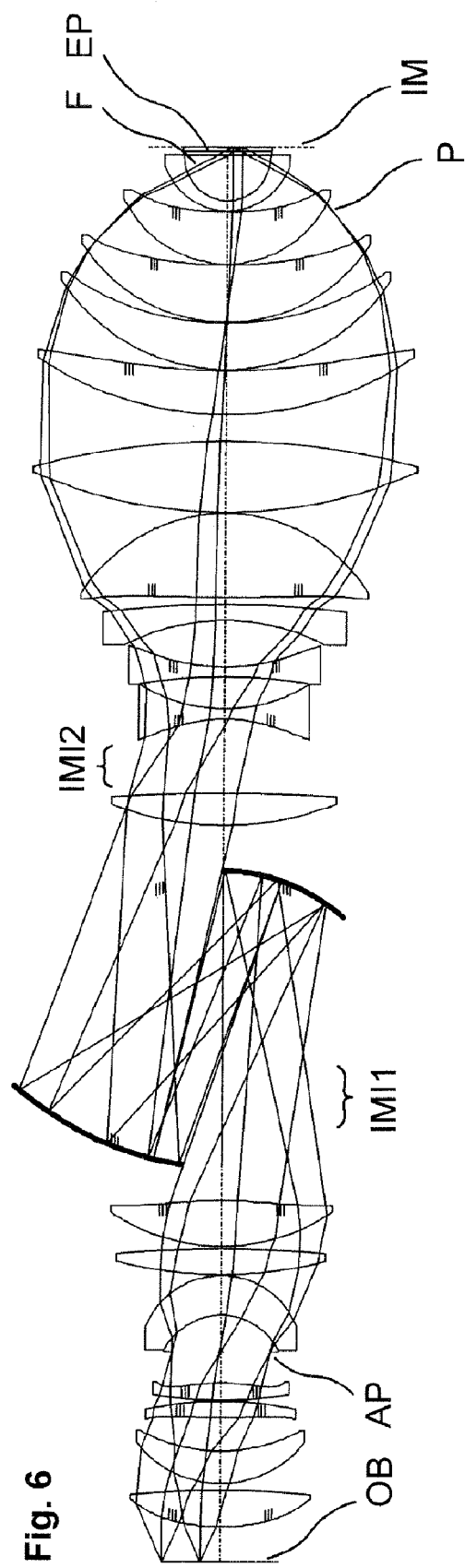

The two embodiments of FIG. 5 and FIG. 6 for the first time exhibit objectives with the numerical aperture NA=1.6 being greater than the refractive index $n_L$ of the solid lenses used. The solid lenses are made from fused silica with $n_L=1.56$. The refractive index of the liquid lens F is $n_F=1.80$. Also these embodiments are corrected much better than in a diffraction-limited fashion, their image field being 20 mm×4 mm at a decentering of 4.375 mm. The RMS wavefront error is below a tenth of the operating wavelength 193.4 mm.

Here, as well, the object-side objective part is purely refractive. It includes the accessible and stop-down diaphragm plane AP and strong aspherics preceding the diaphragm plane AP. Here these aspherics are two lenses of lesser refractive power but stronger modulation of the aspheric shape deviation, surfaces 5 and 8 in table 5a/b. Arranged subsequent to these aspherics is a likewise strongly curved meniscus lens, surfaces 10, 11 in table 5a/6.

The intermediate objective part is once again a prolate catadioptric objective with two concave mirrors, similar to FIG. 1-3, but now with a positive field lens (surfaces 20, 21 in table 5a) preceding the second intermediate image IMI2.

The positive field lens replaces the positive first lens group present in FIG. 1-3 in the image-side objective part.

The image-side objective part thus begins with a negative lens group and forms a belly with a multilens positive lens group. In the embodiment of FIG. 5 the greatest lens diameter is reached with 165 mm at the lenses 30/31 and 32/33 as can be seen in table 5a. A plurality of positive meniscus lenses which are concave in relation to the image plane IM is arranged subsequent to these lenses. The pupil P of the image-side objective part lies in the region of these meniscus lenses. The last fused silica lens (surfaces 40, 41 of table 5a) on the image side is once again of negative refractive power in the paraxial region. This lens is formed as a meniscus lens with a concave surface on the image side whose thickness is 8.9 mm and thus smaller than the difference of the radii 58.8 mm-37.8 mm=21 mm.

In the embodiment of FIG. 5, the liquid lens F is immersion at the same time, and thus abuts the image plane IM and the object, which is arranged there in order to exposed. This object can be, for example, a wafer. The radius of the spherical surface 41 is 37.8 mm and thus smaller than the thickness of 45.8 mm. The sine of the angle of incidence is smaller than 0.89 at all surfaces. The catadioptric intermediate objective part is enlarging. The sines of the angles of incidence at the concave mirrors are below 0.45.

The embodiment of FIG. 6 and table 6a/b comprise a 3.0 mm thick end plate EP made from sapphire. The liquid lens F is now formed between the surfaces 42, 43 of table 6a. Their thickness is 40.2 mm, the radius is 38.1 mm. The thickness is thus 105% of the radius.

It has thus been shown that liquid lenses F of high refractive index permit the design of high-quality projection objectives with extreme numerical apertures.

Multivarious approaches and instructions are thus given to the person skilled in the art in order to use this teaching for further developing different kinds of known approaches in designing objectives.

TABLE 1a

| SURF | RADIUS | THICKNESS | MATERIAL | INDEX | SEMIDIAM. |
|---|---|---|---|---|---|
| 0 = OB | ∞ | 35.000000 | | 1.00030168 | 66.000 |
| 1 | ∞ | 0.100881 | | 1.00030168 | 77.003 |
| 2 | 173.279980 | 34.026411 | SIO2V | 1.56078570 | 90.000 |
| 3 | −1081.359892 | 2.602590 | | 1.00029966 | 90.000 |
| 4 | 284.316798 | 47.383982 | SIO2V | 1.56078570 | 95.000 |
| 5 | −1674.306964 | 22.855576 | | 1.00029966 | 95.000 |
| 6 | 577.261196 | 36.645573 | SIO2V | 1.56078570 | 76.354 |
| 7 | −314.377359 | 0.999980 | | 1.00029966 | 73.677 |
| 8 | 290.150309 | 25.000000 | SIO2V | 1.56078570 | 75.000 |
| 9 | −348.828624 | 1.000000 | | 1.00029966 | 75.000 |
| 10 | 357.767685 | 29.107951 | SIO2V | 1.56078570 | 75.000 |
| 11 | −185.316330 | 18.309132 | | 1.00029966 | 75.000 |
| 12 | ∞ | 0.000000 | | 1.00029966 | 36.370 |
| 13 | ∞ | 10.000000 | SIO2V | 1.56078570 | 44.778 |
| 14 | ∞ | 24.909905 | | 1.00029966 | 47.596 |
| 15 | −65.374870 | 14.999947 | SIO2V | 1.56078570 | 50.000 |
| 16 | −87.154980 | 13.643080 | | 1.00029966 | 60.000 |
| 17 | −175.112352 | 18.964687 | SIO2V | 1.56078570 | 65.000 |
| 18 | −111.646867 | 1.049880 | | 1.00029966 | 70.000 |
| 19 | −155.839260 | 37.603622 | SIO2V | 1.56078570 | 80.000 |
| 20 | −102.943508 | 0.099910 | | 1.00029966 | 80.000 |
| 21 | ∞ | 40.000000 | | 1.00029966 | 90.389 |
| 22 | ∞ | 209.622700 | | 1.00029966 | 92.498 |
| 23 | −166.402525 | −209.622700 | REFL | 1.00029966 | 150.000 |
| 24 | 173.713446 | 209.622700 | REFL | 1.00029966 | 125.000 |
| 25 | ∞ | 40.000000 | | 1.00029966 | 99.138 |
| 26 | ∞ | 0.100021 | | 1.00029966 | 105.283 |
| 27 | 174.736655 | 46.035435 | SIO2V | 1.56078570 | 110.000 |
| 28 | 369.899337 | 2.484896 | | 1.00029966 | 105.000 |
| 29 | 511.775400 | 10.000000 | SIO2V | 1.56078570 | 95.000 |
| 30 | 117.498299 | 37.368783 | | 1.00029966 | 80.000 |
| 31 | −690.607305 | 10.000000 | SIO2V | 1.56078570 | 80.000 |
| 32 | 153.845418 | 25.455370 | | 1.00029966 | 80.000 |
| 33 | 20331.979093 | 10.000000 | SIO2V | 1.56078570 | 90.000 |
| 34 | 347.272006 | 22.437822 | | 1.00029966 | 90.000 |
| 35 | 502.344250 | 44.143760 | SIO2V | 1.56078570 | 120.000 |
| 36 | −231.373663 | 17.400867 | | 1.00029966 | 120.000 |
| 37 | −837.483770 | 31.483968 | SIO2V | 1.56078570 | 130.000 |
| 38 | −254.746002 | 6.600316 | | 1.00029966 | 135.000 |
| 39 | −392.185232 | 82.775939 | SIO2V | 1.56078570 | 140.000 |
| 40 | −196.513232 | 1.000000 | | 1.00029966 | 155.000 |
| 41 | 610.397747 | 56.287416 | SIO2V | 1.56078570 | 160.000 |
| 42 | −556.907407 | 0.999835 | | 1.00029966 | 160.000 |

TABLE 1a-continued

| SURF | RADIUS | THICKNESS | MATERIAL | INDEX | SEMIDIAM. |
|---|---|---|---|---|---|
| 43 | 296.607308 | 48.957456 | SIO2V | 1.56078570 | 150.000 |
| 44 | −1578.327293 | 1.000000 | | 1.00029966 | 150.000 |
| 45 | 216.352446 | 43.826306 | SIO2V | 1.56078570 | 125.000 |
| 46 | 2322.892305 | 1.000000 | | 1.00029966 | 125.000 |
| 47 | 101.534703 | 42.624105 | SIO2V | 1.56078570 | 88.000 |
| 48 | 255.691515 | 0.999893 | | 1.00029966 | 85.000 |
| 49 | 66.827516 | 10.000000 | SIO2V | 1.56078570 | 52.000 |
| 50 | 34.581844 | 30.092080 | (F) | 1.65000000 | 34.000 |
| 51 | ∞ | 3.000000 | (F) | 1.65000000 | 34.000 |
| 52 = IM | ∞ | | | | 34.000 |

TABLE 1b

ASPHERIC ONSTANTS

| SRF | 2 | 5 | 7 | 17 | 19 |
|---|---|---|---|---|---|
| K | 0 | 0 | 0 | 0 | 0 |
| C1 | −5.719118e−08 | −1.218375e−07 | 4.192613e−07 | −2.035191e−07 | 6.581837e−08 |
| C2 | −6.011473e−13 | 9.454546e−12 | 4.225479e−12 | −2.746520e−11 | 1.290762e−11 |
| C3 | −2.863941e−16 | −1.629731e−15 | 1.483284e−15 | −2.529717e−15 | 6.638127e−16 |
| C4 | 2.205921e−20 | 1.088963e−19 | 3.420546e−19 | 5.381454e−19 | −2.943367e−19 |
| C5 | −5.981074e−24 | 8.373344e−24 | −2.828899e−23 | −1.447893e−22 | 3.550178e−24 |
| C6 | 1.047361e−27 | −1.832764e−27 | −1.680731e−27 | −3.175732e−27 | 6.050767e−28 |
| C7 | −1.013527e−31 | 1.046373e−31 | 2.906586e−31 | 5.176529e−30 | 4.358568e−31 |
| C8 | 4.076124e−36 | −1.708389e−36 | −5.252329e−35 | −1.024665e−33 | −4.270946e−35 |

| SRF | 23 | 24 | 28 | 36 | 37 |
|---|---|---|---|---|---|
| K | −0.602272 | −0.240254 | 0 | 0 | 0 |
| C1 | 0.000000e+00 | 0.000000e+00 | −1.628020e−07 | 2.060497e−08 | −7.918942e−08 |
| C2 | −9.110764e−15 | 3.799619e−15 | 5.004648e−12 | 6.206171e−13 | −7.390346e−13 |
| C3 | −6.923032e−20 | 1.050462e−19 | 1.238115e−16 | 1.568846e−16 | 1.677228e−16 |
| C4 | −1.592422e−23 | 2.407529e−23 | 1.345805e−20 | −1.970417e−20 | −6.727857e−21 |
| C5 | 8.704660e−28 | −2.336605e−27 | −5.722714e−24 | 2.817612e−24 | 6.703292e−25 |
| C6 | −3.848813e−32 | 2.089863e−31 | 7.429779e−28 | −2.065939e−28 | −1.712552e−29 |
| C7 | 8.257231e−37 | −8.540536e−36 | −5.390293e−32 | 7.979829e−33 | −9.430098e−34 |
| C8 | −7.590177e−42 | 1.725784e−40 | 1.988577e−36 | −1.039469e−37 | 4.239222e−38 |

| SRF | 39 | 43 | 46 |
|---|---|---|---|
| K | 0 | 0 | 0 |
| C1 | 5.160606e−09 | −2.788258e−08 | −2.365786e−08 |
| C2 | −2.393183e−13 | 4.064341e−13 | 3.640299e−12 |
| C3 | −7.204528e−17 | 2.762083e−17 | −1.570433e−16 |
| C4 | −1.517240e−22 | −4.172618e−22 | 6.381899e−21 |
| C5 | −3.032479e−27 | −3.754486e−27 | −3.770869e−26 |
| C6 | 1.227351e−29 | −6.324033e−31 | −1.116749e−29 |
| C7 | −8.867490e−34 | 3.185590e−35 | 6.455153e−34 |
| C8 | 2.067251e−38 | −4.120762e−40 | −1.076920e−38 |

TABLE 2a

| SURF | RADIUS | THICKNESS | MATERIAL | INDEX | SEMIDIAM. |
|---|---|---|---|---|---|
| 0 = OB | ∞ | 35.000000 | | 1.00030168 | 66.000 |
| 1 | ∞ | 1.166644 | | 1.00030168 | 77.003 |
| 2 | 197.911058 | 20.674095 | SIO2V | 1.56078570 | 90.000 |
| 3 | 635.116021 | 2.894278 | | 1.00029966 | 90.000 |
| 4 | 154.515346 | 52.818599 | SIO2V | 1.56078570 | 95.000 |
| 5 | −674.545898 | 46.213532 | | 1.00029966 | 95.000 |
| 6 | 351.508267 | 12.006164 | SIO2V | 1.56078570 | 76.354 |
| 7 | −355.431508 | 1.879459 | | 1.00029966 | 73.677 |
| 8 | 137.853261 | 42.368303 | SIO2V | 1.56078570 | 75.000 |
| 9 | −168.451126 | 1.576637 | | 1.00029966 | 75.000 |
| 10 | ∞ | 18.000000 | | 1.00029966 | 36.370 |
| 11 | ∞ | 10.000000 | SIO2V | 1.56078570 | 44.778 |
| 12 | ∞ | 25.245183 | | 1.00029966 | 47.596 |
| 13 | −69.535170 | 15.000107 | SIO2V | 1.56078570 | 50.000 |
| 14 | −125.326320 | 1.000069 | | 1.00029966 | 60.000 |
| 15 | −178.873389 | 25.788410 | SIO2V | 1.56078570 | 65.000 |
| 16 | −101.720844 | 15.664259 | | 1.00029966 | 70.000 |

TABLE 2a-continued

| SURF | RADIUS | THICKNESS | MATERIAL | INDEX | SEMIDIAM. |
|---|---|---|---|---|---|
| 17 | −199.223616 | 36.639577 | SIO2V | 1.56078570 | 80.000 |
| 18 | −102.251112 | 0.099749 |  | 1.00029966 | 80.000 |
| 19 | ∞ | 40.000000 |  | 1.00029966 | 90.389 |
| 20 | ∞ | 209.622700 |  | 1.00029966 | 92.498 |
| 21 | −166.119896 | −209.622700 | REFL | 1.00029966 | 150.000 |
| 22 | 175.984040 | 209.622700 | REFL | 1.00029966 | 125.000 |
| 23 | ∞ | 40.000000 |  | 1.00029966 | 99.138 |
| 24 | ∞ | 0.172730 |  | 1.00029966 | 105.283 |
| 25 | 253.724164 | 38.159409 | SIO2V | 1.56078570 | 110.000 |
| 26 | −576.959427 | 1.129890 |  | 1.00029966 | 110.000 |
| 27 | 969.471804 | 12.758546 | SIO2V | 1.56078570 | 105.000 |
| 28 | 349.602989 | 0.999948 |  | 1.00029966 | 105.000 |
| 29 | 528.180407 | 10.000000 | SIO2V | 1.56078570 | 95.000 |
| 30 | 121.034243 | 37.709281 |  | 1.00029966 | 80.000 |
| 31 | −511.453381 | 10.000000 | SIO2V | 1.56078570 | 80.000 |
| 32 | 144.865830 | 27.748574 |  | 1.00029966 | 80.000 |
| 33 | −2683.436282 | 10.000000 | SIO2V | 1.56078570 | 90.000 |
| 34 | 350.818886 | 21.231421 |  | 1.00029966 | 90.000 |
| 35 | 564.353180 | 43.838798 | SIO2V | 1.56078570 | 120.000 |
| 36 | −231.828235 | 17.071926 |  | 1.00029966 | 120.000 |
| 37 | −844.682254 | 27.174378 | SIO2V | 1.56078570 | 130.000 |
| 38 | −257.084208 | 13.572085 |  | 1.00029966 | 135.000 |
| 39 | −347.360290 | 79.971864 | SIO2V | 1.56078570 | 140.000 |
| 40 | −191.420105 | 1.000000 |  | 1.00029966 | 155.000 |
| 41 | 638.593875 | 53.484057 | SIO2V | 1.56078570 | 160.000 |
| 42 | −617.708478 | 0.999739 |  | 1.00029966 | 160.000 |
| 43 | 290.550562 | 51.321670 | SIO2V | 1.56078570 | 150.000 |
| 44 | −1239.997337 | 1.000000 |  | 1.00029966 | 150.000 |
| 45 | 234.055441 | 41.191419 | SIO2V | 1.56078570 | 125.000 |
| 46 | 1260.796700 | 1.000000 |  | 1.00029966 | 125.000 |
| 47 | 119.116897 | 46.087832 | SIO2V | 1.56078570 | 92.000 |
| 48 | 410.714306 | 0.999596 |  | 1.00029966 | 90.000 |
| 49 | 57.007308 | 19.999880 | SIO2V | 1.56078570 | 52.000 |
| 50 | 70.000000 | 24.719485 | (F) | 1.65000000 | 48.000 |
| 51 | ∞ | 3.000000 | (F) | 1.65000000 | 34.000 |
| 52 = IM | ∞ |  |  |  | 34.000 |

TABLE 2b

| ASPHERIC CONSTANTS | | | | | |
|---|---|---|---|---|---|
| SRF | 2 | 5 | 7 | 15 | 17 |
| K | 0 | 0 | 0 | 0 | 0 |
| C1 | −4.272071e−08 | −6.660852e−08 | 4.612425e−07 | −1.819217e−07 | −2.134272e−08 |
| C2 | −2.130756e−12 | 5.070507e−12 | 1.287676e−11 | −1.679339e−11 | 2.642130e−12 |
| C3 | −3.407494e−16 | −7.615346e−16 | 2.169742e−15 | −4.541462e−15 | 3.144530e−16 |
| C4 | 4.132704e−20 | 7.606615e−20 | 3.202709e−19 | 1.365731e−18 | −1.203833e−19 |
| C5 | −8.614408e−24 | 5.842474e−24 | 1.189789e−22 | −7.298537e−22 | 3.777303e−23 |
| C6 | 1.402057e−27 | −1.689387e−27 | −4.328782e−26 | 1.116111e−25 | −6.878338e−27 |
| C7 | −1.320281e−31 | 1.280496e−31 | 5.025746e−30 | 4.239480e−31 | 6.547727e−31 |
| C8 | 6.029685e−36 | −3.499149e−36 | −2.455352e−34 | −2.801453e−33 | −2.572158e−35 |

| SRF | 21 | 22 | 28 | 36 | 37 |
|---|---|---|---|---|---|
| K | −0.673243 | −0.223377 | 0 | 0 | 0 |
| C1 | 0.000000e+00 | 0.000000e+00 | −1.742865e−07 | −1.146354e−09 | −8.904146e−08 |
| C2 | −1.542990e−14 | 4.242474e−15 | 3.989651e−12 | 6.487508e−13 | −9.704035e−13 |
| C3 | −2.283008e−19 | −1.633115e−19 | 2.232371e−16 | 2.106572e−16 | 1.932349e−16 |
| C4 | −2.701974e−23 | 7.966751e−23 | −2.851297e−20 | −1.981895e−20 | −9.140962e−21 |
| C5 | 1.563798e−27 | −8.898817e−27 | 1.148424e−24 | 2.432642e−24 | 7.612481e−25 |
| C6 | −7.092827e−32 | 6.276885e−31 | 3.102982e−28 | −1.327579e−28 | −5.817189e−30 |
| C7 | 1.654890e−36 | −2.262895e−35 | −5.058499e−32 | 4.126250e−33 | −1.250231e−33 |
| C8 | −1.695530e−41 | 3.532661e−40 | 3.007511e−36 | −3.753435e−38 | 3.610689e−38 |

| SRF | 39 | 43 | 46 |
|---|---|---|---|
| K | 0 | 0 | 0 |
| C1 | 6.669745e−09 | −3.063876e−08 | −3.402805e−08 |
| C2 | 1.190421e−13 | 3.642882e−13 | 4.126635e−12 |
| C3 | −7.888065e−17 | 2.784805e−17 | −1.931151e−16 |
| C4 | −5.882168e−23 | −6.429270e−22 | 8.149530e−21 |
| C5 | 2.413262e−26 | 8.661549e−27 | −7.144438e−26 |
| C6 | 8.242901e−30 | −8.015685e−31 | −1.341671e−29 |

TABLE 2b-continued

| ASPHERIC CONSTANTS | | | |
|---|---|---|---|
| C7 | −6.256631e−34 | 2.825051e−35 | 7.855498e−34 |
| C8 | 1.445073e−38 | −3.170258e−40 | −1.361588e−38 |

TABLE 3a

| SURF | RADIUS | THICKNESS | MATERIAL | INDEX | SEMIDIAM. |
|---|---|---|---|---|---|
| 0 = OB | ∞ | 35.000000 | | 1.00030168 | 66.000 |
| 1 | ∞ | 0.099980 | | 1.00030168 | 77.003 |
| 2 | 170.078547 | 36.468596 | SIO2V | 1.56078570 | 90.000 |
| 3 | −599.314872 | 2.182511 | | 1.00029966 | 90.000 |
| 4 | 333.623154 | 49.026243 | SIO2V | 1.56078570 | 95.000 |
| 5 | −5357.879827 | 17.783452 | | 1.00029966 | 95.000 |
| 6 | 524.085081 | 39.656864 | SIO2V | 1.56078570 | 76.354 |
| 7 | −372.985082 | 1.020916 | | 1.00029966 | 73.677 |
| 8 | 273.494931 | 25.000000 | SIO2V | 1.56078570 | 75.000 |
| 9 | −304.985535 | 1.000000 | | 1.00029966 | 75.000 |
| 10 | 326.223899 | 32.555959 | SIO2V | 1.56078570 | 75.000 |
| 11 | −194.836449 | 18.000006 | | 1.00029966 | 75.000 |
| 12 | ∞ | 0.000000 | | 1.00029966 | 36.370 |
| 13 | ∞ | 10.000000 | SIO2V | 1.56078570 | 44.778 |
| 14 | ∞ | 24.420303 | | 1.00029966 | 47.596 |
| 15 | −65.482398 | 15.000019 | SIO2V | 1.56078570 | 50.000 |
| 16 | −89.830925 | 12.487606 | | 1.00029966 | 60.000 |
| 17 | −181.375682 | 17.778805 | SIO2V | 1.56078570 | 65.000 |
| 18 | −112.069227 | 1.008243 | | 1.00029966 | 70.000 |
| 19 | −158.283947 | 37.090377 | SIO2V | 1.56078570 | 80.000 |
| 20 | −102.436390 | 0.099969 | | 1.00029966 | 80.000 |
| 21 | ∞ | 40.000000 | | 1.00029966 | 90.389 |
| 22 | ∞ | 209.622700 | | 1.00029966 | 92.498 |
| 23 | −166.136319 | −209.622700 | REFL | 1.00029966 | 150.000 |
| 24 | 173.615104 | 209.622700 | REFL | 1.00029966 | 125.000 |
| 25 | ∞ | 40.000000 | | 1.00029966 | 99.138 |
| 26 | ∞ | 0.104935 | | 1.00029966 | 105.283 |
| 27 | 161.705740 | 39.665166 | SIO2V | 1.56078570 | 110.000 |
| 28 | 338.219127 | 4.220151 | | 1.00029966 | 105.000 |
| 29 | 539.284856 | 10.000000 | SIO2V | 1.56078570 | 95.000 |
| 30 | 115.279475 | 38.192763 | | 1.00029966 | 80.000 |
| 31 | −713.073292 | 10.000000 | SIO2V | 1.56078570 | 80.000 |
| 32 | 153.450259 | 25.766812 | | 1.00029966 | 80.000 |
| 33 | −35457.805610 | 10.000000 | SIO2V | 1.56078570 | 90.000 |
| 34 | 338.447211 | 22.577058 | | 1.00029966 | 90.000 |
| 35 | 488.793543 | 45.370961 | SIO2V | 1.56078570 | 120.000 |
| 36 | −229.090765 | 17.224093 | | 1.00029966 | 120.000 |
| 37 | −813.380443 | 31.337371 | SIO2V | 1.56078570 | 130.000 |
| 38 | −255.856356 | 9.074786 | | 1.00029966 | 135.000 |
| 39 | −397.181958 | 81.335823 | SIO2V | 1.56078570 | 140.000 |
| 40 | −197.104943 | 1.000000 | | 1.00029966 | 155.000 |
| 41 | 616.283620 | 55.915659 | SIO2V | 1.56078570 | 160.000 |
| 42 | −558.051853 | 0.999900 | | 1.00029966 | 160.000 |
| 43 | 297.754439 | 48.959126 | SIO2V | 1.56078570 | 150.000 |
| 44 | −1599.554010 | 1.000000 | | 1.00029966 | 150.000 |
| 45 | 216.813876 | 43.986900 | SIO2V | 1.56078570 | 125.000 |
| 46 | 2513.355923 | 1.000000 | | 1.00029966 | 125.000 |
| 47 | 102.047705 | 42.326072 | SIO2V | 1.56078570 | 88.000 |
| 48 | 258.213934 | 1.000000 | | 1.00029966 | 85.000 |
| 49 | 67.045666 | 10.000000 | SIO2V | 1.56078570 | 52.000 |
| 50 | 33.992537 | 27.639900 | (F) | 1.65000000 | 33.000 |
| 51 | ∞ | 3.000000 | | 1.80000000 | 33.000 |
| 52 | ∞ | 3.000000 | (IMMERS.) | 1.65000000 | 33.000 |
| 53 = IM | ∞ | | | | 33.000 |

TABLE 3b

| ASPHERIC CONSTANTS | | | | | |
|---|---|---|---|---|---|
| SRF | 2 | 5 | 7 | 17 | 19 |
| K | 0 | 0 | 0 | 0 | 0 |
| C1 | −6.761238e−08 | −1.339952e−07 | 4.322957e−07 | −1.865717e−07 | 5.694739e−08 |
| C2 | −2.795074e−13 | 8.081896e−12 | 6.638487e−12 | −2.605817e−11 | 1.297663e−11 |
| C3 | −3.419978e−16 | −1.520519e−15 | 1.196137e−15 | −2.223425e−15 | 7.551094e−16 |

TABLE 3b-continued

ASPHERIC CONSTANTS

| | | | | | |
|---|---|---|---|---|---|
| C4 | 3.593975e−20 | 1.158356e−19 | 3.139076e−19 | 4.529397e−19 | −2.801640e−19 |
| C5 | −7.394770e−24 | 8.165985e−24 | −2.103438e−23 | −1.036163e−22 | −1.293839e−24 |
| C6 | 1.067458e−27 | −2.018394e−27 | −2.540248e−27 | −6.085859e−27 | 7.867948e−28 |
| C7 | −9.043542e−32 | 1.252003e−31 | 3.764879e−31 | 4.354732e−30 | 4.763906e−31 |
| C8 | 3.329797e−36 | −2.409824e−36 | −5.551249e−35 | −7.881442e−34 | −4.577122e−35 |

| SRF | 23 | 24 | 28 | 36 | 37 |
|---|---|---|---|---|---|
| K | −0.603427 | −0.236665 | 0 | 0 | 0 |
| C1 | 0.000000e+00 | 0.000000e+00 | −1.724255e−07 | 1.725752e−08 | −8.279489e−08 |
| C2 | −1.058224e−14 | 3.699741e−15 | 4.976445e−12 | 5.471441e−13 | −8.022210e−13 |
| C3 | −1.413269e−19 | −3.750775e−20 | 2.387092e−16 | 1.390990e−16 | 1.431148e−16 |
| C4 | −1.204112e−23 | 5.430640e−23 | 5.525729e−21 | −1.755950e−20 | −5.767930e−21 |
| C5 | 4.963866e−28 | −5.801174e−27 | −6.052665e−24 | 2.625696e−24 | 6.871766e−25 |
| C6 | −2.129066e−32 | 4.279164e−31 | 7.725095e−28 | −1.914617e−28 | −2.240962e−29 |
| C7 | 3.795477e−37 | −1.574698e−35 | −5.045738e−32 | 7.395971e−33 | −3.639715e−34 |
| C8 | −2.918284e−42 | 2.685481e−40 | 1.564423e−36 | −7.980691e−38 | 3.135529e−38 |

| SRF | 39 | 43 | 46 |
|---|---|---|---|
| K | 0 | 0 | 0 |
| C1 | 5.939680e−09 | −2.752287e−08 | −2.413171e−08 |
| C2 | −2.375134e−13 | 4.114456e−13 | 3.695674e−12 |
| C3 | −6.806224e−17 | 2.737675e−17 | −1.621470e−16 |
| C4 | −8.082613e−23 | −3.526372e−22 | 6.681382e−21 |
| C5 | −1.967221e−26 | −7.704679e−27 | −4.618168e−26 |
| C6 | 1.266402e−29 | −4.719101e−31 | −1.117841e−29 |
| C7 | −8.622711e−34 | 2.794633e−35 | 6.554350e−34 |
| C8 | 1.902299e−38 | −3.716332e−40 | −1.099816e−38 |

TABLE 4a

| SURF | RADIUS | THICKNESS | MATERIAL | INDEX | SEMIDIAM. |
|---|---|---|---|---|---|
| 0 = OB | ∞ | 101.496840 | | | 62.000 |
| 1 | −523.184936 | 27.851984 | SIO2 | 1.56032610 | 96.419 |
| 2 | −210.066935 | 0.999968 | | | 99.916 |
| 3 | 143.399781 | 52.055602 | SIO2 | 1.56032610 | 115.102 |
| 4 | 345.776862 | 35.383042 | | | 110.966 |
| 5 | 168.075295 | 52.902563 | SIO2 | 1.56032610 | 95.593 |
| 6 | −581.011371 | 0.099991 | | | 85.017 |
| 7 | 82.494445 | 46.014670 | SIO2 | 1.56032610 | 65.623 |
| 8 | 74.608756 | 18.376623 | | | 43.366 |
| 9 | ∞ | 0.000000 | SIO2 | 1.56032610 | 40.333 |
| 10 | ∞ | 9.898700 | | | 40.333 |
| 11 | −93.661632 | 25.608969 | SIO2 | 1.56032610 | 40.388 |
| 12 | −97.944812 | 42.548618 | | | 50.610 |
| 13 | −63.503040 | 54.172316 | SIO2 | 1.56032610 | 58.454 |
| 14 | −94.409957 | 1.264244 | | | 87.595 |
| 15 | −328.877474 | 40.537580 | SIO2 | 1.56032610 | 104.907 |
| 16 | −131.896136 | 1.001643 | | | 106.846 |
| 17 | 204.370502 | 42.653441 | SIO2 | 1.56032610 | 107.596 |
| 18 | −2747.675446 | 1.723900 | | | 105.816 |
| 19 | 216.208053 | 27.952948 | SIO2 | 1.56032610 | 97.813 |
| 20 | 2712.784924 | 99.872557 | | | 94.335 |
| 21 = FM1 | ∞ | −160.545313 | REFL | | 27.154 |
| 22 | 101.244286 | −12.500000 | SIO2 | 1.56032610 | 72.986 |
| 23 | 628.850173 | −53.212241 | | | 88.277 |
| 24 | 102.805812 | −12.500000 | SIO2 | 1.56032610 | 91.193 |
| 25 | 200.305727 | −25.464217 | | | 119.887 |
| 26 | 150.933505 | 25.464217 | REFL | | 122.686 |
| 27 | 200.305727 | 12.500000 | SIO2 | 1.56032610 | 119.499 |
| 28 | 102.805812 | 53.212241 | | | 90.105 |
| 29 | 628.850173 | 12.500000 | SIO2 | 1.56032610 | 85.671 |
| 30 | 101.244286 | 160.545353 | | | 71.821 |
| 31 = FM2 | ∞ | −109.999623 | REFL | | 134.552 |
| 32 | 862.422907 | −30.130833 | SIO2 | 1.56032610 | 102.165 |
| 33 | 229.773890 | −0.999915 | | | 105.942 |
| 34 | −617.789022 | −35.509195 | SIO2 | 1.56032610 | 118.697 |
| 35 | 565.469461 | −0.999931 | | | 120.255 |
| 36 | −246.806971 | −44.859593 | SIO2 | 1.56032610 | 124.965 |
| 37 | 32400.831779 | −0.099930 | | | 123.417 |
| 38 | −158.610832 | −71.070427 | SIO2 | 1.56032610 | 112.458 |
| 39 | −1341.469728 | −8.796304 | | | 98.473 |

TABLE 4a-continued

| SURF | RADIUS | THICKNESS | MATERIAL | INDEX | SEMIDIAM. |
|---|---|---|---|---|---|
| 40 | 3541.685396 | −11.999956 | SIO2 | 1.56032610 | 96.987 |
| 41 | −126.167849 | −44.791303 | | | 78.038 |
| 42 | 469.858200 | −11.999957 | SIO2 | 1.56032610 | 78.204 |
| 43 | −108.758112 | −27.637030 | | | 84.487 |
| 44 | −1480.509587 | −15.438600 | SIO2 | 1.56032610 | 86.624 |
| 45 | 2433.499100 | −49.439954 | | | 90.710 |
| 46 | −1932.185692 | −25.660740 | SIO2 | 1.56032610 | 119.141 |
| 47 | 428.080551 | −0.999961 | | | 123.769 |
| 48 | −408.475637 | −36.662820 | SIO2 | 1.56032610 | 147.587 |
| 49 | −16389.465356 | −7.335981 | | | 148.838 |
| 50 | −342.428932 | −60.116835 | SIO2 | 1.56032610 | 158.305 |
| 51 | 658.847066 | −0.091541 | | | 157.731 |
| 52 | ∞ | 0.000000 | SIO2 | 1.56032610 | 156.315 |
| 53 | ∞ | −2.670708 | | | 156.315 |
| 54 | −702.444090 | −32.792626 | SIO2 | 1.56032610 | 155.963 |
| 55 | 1222.808780 | −0.999915 | | | 155.470 |
| 56 | −309.712976 | −41.860232 | SIO2 | 1.56032610 | 144.999 |
| 57 | 3694.385507 | −0.999819 | | | 144.012 |
| 58 | −135.513673 | −31.965622 | SIO2 | 1.56032610 | 109.063 |
| 59 | −185.513505 | −0.999775 | | | 103.967 |
| 60 | −88.090936 | −38.540831 | SIO2 | 1.56032610 | 80.707 |
| 61 | −187.712668 | −0.999577 | | | 73.736 |
| 62 | −58.692832 | −9.999803 | SIO2 | 1.56032610 | 51.770 |
| 63 | −33.167937 | −38.114503 | (F) | 1.65000000 | 33.117 |
| 64 | ∞ | −3.000000 | (F) | 1.65000000 | 20.048 |
| 65 = IM | ∞ | | | | 15.841 |

TABLE 4b

ASPHERIC CONSTANTS

| SRF | 6 | 15 | 20 | 22 | 30 | 39 | 41 |
|---|---|---|---|---|---|---|---|
| K | 0 | 0 | 0 | 0 | 0 | 0 | 0 |
| C1 | 1.190289e−07 | −1.976769e−08 | 4.403358e−08 | −6.572731e−08 | −6.572731e−08 | 1.699431e−08 | −2.143897e−07 |
| C2 | −2.160947e−12 | 1.109889e−12 | 8.071972e−17 | −4.743844e−12 | −4.743844e−12 | −9.046901e−12 | 2.732198e−12 |
| C3 | 6.852608e−16 | −3.889116e−17 | 3.366541e−18 | −9.012440e−18 | −9.012440e−18 | 1.128480e−15 | −1.371285e−15 |
| C4 | −3.837379e−20 | −1.882901e−21 | 5.100729e−22 | −1.597994e−19 | −1.597994e−19 | −9.595855e−20 | −1.137997e−19 |
| C5 | 1.217764e−25 | 1.332477e−25 | −4.259657e−26 | 2.141145e−23 | 2.141145e−23 | 5.011204e−24 | 2.693954e−23 |
| C6 | 2.211313e−28 | −2.258521e−30 | 2.686157e−30 | −2.250289e−27 | −2.250289e−27 | −1.196219e−28 | −3.312568e−27 |

| SRF | 43 | 46 | 51 | 59 | 61 |
|---|---|---|---|---|---|
| K | 0 | 0 | 0 | 0 | 0 |
| C1 | 2.168103e−07 | 3.156834e−08 | −7.013045e−09 | 4.429013e−08 | −9.119846e−08 |
| C2 | 1.367067e−12 | 3.487654e−13 | 5.963914e−16 | −4.664097e−12 | −9.933832e−12 |
| C3 | 3.062347e−16 | −1.560492e−17 | −1.630073e−17 | 3.978191e−16 | 4.577490e−16 |
| C4 | 5.350290e−20 | 1.140928e−21 | 5.396066e−22 | −1.307434e−20 | −2.618132e−19 |
| C5 | −4.811379e−24 | −4.815997e−26 | −7.602819e−27 | −5.651715e−25 | 5.019446e−23 |
| C6 | 4.970104e−28 | 5.836063e−31 | 4.085943e−32 | 3.529575e−29 | −5.414482e−27 |

TABLE 5a

| SURF | RADIUS | THICKNESS | MATERIAL | INDEX | SEMIDIAM. |
|---|---|---|---|---|---|
| 0 = OB | ∞ | 31.284792 | | | 52.000 |
| 1 | 194.413567 | 32.720399 | SIO2V | 1.56078570 | 74.615 |
| 2 | −837.875926 | 6.370734 | | | 74.349 |
| 3 | 95.475130 | 26.728836 | SIO2V | 1.56078570 | 70.388 |
| 4 | 148.726918 | 30.489652 | | | 65.856 |
| 5 | 1084.901978 | 14.117445 | SIO2V | 1.56078570 | 60.419 |
| 6 | −329.264238 | 0.743287 | | | 58.910 |
| 7 | 372.368293 | 15.458004 | SIO2V | 1.56078570 | 54.832 |
| 8 | −148.979042 | 27.240305 | | | 52.113 |
| 9 | ∞ | 32.301644 | | | 43.951 |
| 10 | −57.723183 | 31.449460 | SIO2V | 1.56078570 | 47.695 |
| 11 | −71.150453 | 0.929754 | | | 62.740 |
| 12 | 383.639393 | 22.046149 | SIO2V | 1.56078570 | 83.185 |
| 13 | −904.695268 | 0.905975 | | | 84.675 |
| 14 | 179.698033 | 38.448563 | SIO2V | 1.56078570 | 90.818 |
| 15 | −389.247961 | 29.862111 | | | 90.050 |
| 16 | ∞ | 258.234067 | | | 85.109 |

TABLE 5a-continued

| SURF | RADIUS | THICKNESS | MATERIAL | INDEX | SEMIDIAM. |
|---|---|---|---|---|---|
| 17 | −151.387947 | −258.234067 | REFL | | 103.744 |
| 18 | 258.267631 | 258.234067 | REFL | | 180.342 |
| 19 | ∞ | 29.981280 | | | 116.992 |
| 20 | 251.052546 | 31.241091 | SIO2V | 1.56078570 | 101.576 |
| 21 | −6016.827917 | 77.406555 | | | 98.554 |
| 22 | −125.618112 | 8.960662 | SIO2V | 1.56078570 | 70.289 |
| 23 | 129.125754 | 28.406854 | | | 68.882 |
| 24 | −681.780853 | 8.898731 | SIO2V | 1.56078570 | 70.634 |
| 25 | 205.568565 | 41.577461 | | | 78.503 |
| 26 | −183.215344 | 15.843375 | SIO2V | 1.56078570 | 82.563 |
| 27 | −747.008350 | 6.201177 | | | 102.654 |
| 28 | 1186.195936 | 72.658205 | SIO2V | 1.56078570 | 120.160 |
| 29 | −156.971444 | 0.905847 | | | 126.492 |
| 30 | 648.451941 | 66.013805 | SIO2V | 1.56078570 | 163.810 |
| 31 | −396.824326 | 25.988117 | | | 165.175 |
| 32 | 289.870283 | 40.412480 | SIO2V | 1.56078570 | 163.677 |
| 33 | 480.887470 | 0.928925 | | | 161.538 |
| 34 | 178.362272 | 40.967739 | SIO2V | 1.56078570 | 144.125 |
| 35 | 253.519298 | 0.947294 | | | 138.643 |
| 36 | 154.855021 | 52.211656 | SIO2V | 1.56078570 | 125.560 |
| 37 | 522.613285 | 0.825571 | | | 119.129 |
| 38 | 100.582695 | 44.936735 | SIO2V | 1.56078570 | 88.620 |
| 39 | 272.608820 | 0.825571 | | | 79.210 |
| 40 | 58.829925 | 8.861393 | SIO2V | 1.56078570 | 52.876 |
| 41 | 37.856352 | 45.769132 | (F) | 1.80000000 | 37.564 |
| 42 = IM | ∞ | | | | 13.001 |

TABLE 5b

ASPHERIC CONSTANTS

| SRF | 1 | 5 | 8 | 15 | 17 | 18 |
|---|---|---|---|---|---|---|
| K | 0 | 0 | 0 | 0 | 0 | −0.267731 |
| C1 | 2.035368e−07 | 1.161173e−07 | 6.549025e−07 | 1.058964e−07 | 1.486128e−08 | −7.023674e−10 |
| C2 | 2.122045e−13 | −9.174854e−11 | 1.133907e−11 | −1.960464e−12 | 6.224903e−13 | −9.477643e−15 |
| C3 | −1.232124e−15 | 9.078126e−15 | 2.931708e−14 | −1.719346e−16 | 1.675590e−17 | −7.423466e−20 |
| C4 | 6.485869e−20 | −1.260952e−18 | −8.285156e−18 | 2.217335e−20 | 1.269177e−21 | −4.429195e−24 |
| C5 | 9.917577e−24 | 2.019305e−22 | 3.500031e−21 | −1.159319e−24 | −5.260128e−26 | 4.705745e−29 |
| C6 | −9.582163e−28 | −7.811919e−27 | 3.522430e−26 | 2.527662e−29 | 4.654328e−30 | −1.008977e−33 |

| SRF | 22 | 25 | 28 | 33 | 37 | 39 |
|---|---|---|---|---|---|---|
| K | 0 | 0 | 0 | 0 | 0 | 0 |
| C1 | 4.605486e−07 | 2.881794e−07 | −3.576109e−08 | −1.085274e−08 | 2.842058e−08 | 1.106769e−07 |
| C2 | −7.227058e−11 | −4.494181e−11 | 8.140963e−13 | 1.115172e−13 | −9.189727e−15 | 2.940296e−12 |
| C3 | 1.056869e−14 | −2.448411e−15 | −3.935804e−17 | −9.843842e−18 | 7.067187e−17 | −8.536341e−17 |
| C4 | −1.243813e−18 | 9.621332e−19 | −7.624420e−22 | −1.420093e−22 | −5.862923e−21 | 4.590349e−20 |
| C5 | 1.098424e−22 | −9.474976e−23 | 1.473104e−25 | 1.350399e−26 | 2.902121e−25 | −8.754730e−24 |
| C6 | −3.554283e−27 | 3.735014e−27 | −5.284140e−30 | −1.682167e−31 | −4.976330e−30 | 5.665333e−28 |

TABLE 6a

| SURF | RADIUS | THICKNESS | MATERIAL | INDEX | SEMIDIAM. |
|---|---|---|---|---|---|
| 0 = OB | ∞ | 31.284792 | | | 52.000 |
| 1 | ∞ | 0.000000 | | | 65.651 |
| 2 | 193.599182 | 32.235664 | SIO2V | 1.56078570 | 74.583 |
| 3 | −988.153919 | 6.121005 | | | 74.317 |
| 4 | 95.312730 | 28.437060 | SIO2V | 1.56078570 | 70.720 |
| 5 | 149.958061 | 29.337945 | | | 65.762 |
| 6 | 990.600274 | 14.692793 | SIO2V | 1.56078570 | 60.664 |
| 7 | −304.549723 | 0.925424 | | | 59.160 |
| 8 | 405.862783 | 15.231330 | SIO2V | 1.56078570 | 54.862 |
| 9 | −150.695673 | 27.371286 | | | 52.107 |
| 10 | ∞ | 32.082969 | | | 43.913 |
| 11 | −57.761263 | 34.954745 | SIO2V | 1.56078570 | 47.628 |
| 12 | −73.049428 | 0.946034 | | | 64.468 |
| 13 | 371.078196 | 22.631363 | SIO2V | 1.56078570 | 85.710 |
| 14 | −1054.171246 | 2.527973 | | | 87.142 |
| 15 | 176.905790 | 40.262309 | SIO2V | 1.56078570 | 93.860 |
| 16 | −409.710820 | 29.670881 | | | 92.937 |

TABLE 6a-continued

| SURF | RADIUS | THICKNESS | MATERIAL | INDEX | SEMIDIAM. |
|---|---|---|---|---|---|
| 17 | ∞ | 262.083723 | | | 87.656 |
| 18 | −152.961072 | −262.083723 | REFL | | 102.730 |
| 19 | 259.893027 | 262.083723 | REFL | | 180.288 |
| 20 | ∞ | 40.275992 | | | 112.284 |
| 21 | 277.112135 | 28.048210 | SIO2V | 1.56078570 | 94.722 |
| 22 | −1786.674721 | 65.923060 | | | 91.958 |
| 23 | −115.766876 | 9.003310 | SIO2V | 1.56078570 | 70.538 |
| 24 | 143.904953 | 28.199458 | | | 69.827 |
| 25 | −500.404643 | 8.993973 | SIO2V | 1.56078570 | 71.476 |
| 26 | 231.435891 | 40.923491 | | | 79.540 |
| 27 | −194.421161 | 14.041869 | SIO2V | 1.56078570 | 83.835 |
| 28 | −929.354406 | 6.572149 | | | 102.684 |
| 29 | 1551.636561 | 74.150055 | SIO2V | 1.56078570 | 118.556 |
| 30 | −151.390217 | 0.924156 | | | 124.858 |
| 31 | 430.573439 | 62.728287 | SIO2V | 1.56078570 | 165.041 |
| 32 | −668.844997 | 23.423849 | | | 165.694 |
| 33 | 303.567518 | 38.823785 | SIO2V | 1.56078570 | 163.062 |
| 34 | 524.212908 | 0.932060 | | | 160.960 |
| 35 | 176.353964 | 40.731123 | SIO2V | 1.56078570 | 143.422 |
| 36 | 247.491117 | 0.936510 | | | 137.926 |
| 37 | 153.122143 | 51.077607 | SIO2V | 1.56078570 | 124.946 |
| 38 | 412.041144 | 0.825571 | | | 118.371 |
| 39 | 101.547710 | 45.611823 | SIO2V | 1.56078570 | 89.393 |
| 40 | 315.478434 | 0.825571 | | | 80.057 |
| 41 | 58.429322 | 8.969645 | SIO2V | 1.56078570 | 53.083 |
| 42 | 38.144755 | 40.197998 | (F) | 1.80000000 | 37.922 |
| 43 | ∞ | 3.000000 | SAPHIR | 1.92650829 | 25.925 |
| 44 | ∞ | 4.345594 | (IMMERS.) | 1.80000000 | 21.446 |
| 45 = IM | ∞ | | | | 13.000 |

TABLE 6b

ASPHERIC CONSTANTS

| SRF | 2 | 6 | 9 | 16 | 18 | 19 |
|---|---|---|---|---|---|---|
| K  | 0 | 0 | 0 | 0 | 0 | −0.273225 |
| C1 | 1.958847e−07 | 1.048404e−07 | 6.380918e−07 | 1.042335e−07 | 1.494444e−08 | −4.825071e−10 |
| C2 | 8.684629e−13 | −9.344654e−11 | 1.135337e−11 | −1.647926e−12 | 6.329335e−13 | −6.621967e−15 |
| C3 | −1.177298e−15 | 9.684195e−15 | 2.969291e−14 | −1.770077e−16 | 1.568829e−17 | −6.600515e−20 |
| C4 | 5.172091e−20 | −1.242151e−18 | −8.230472e−18 | 1.938739e−20 | 1.153993e−21 | −4.043335e−24 |
| C5 | 1.115087e−23 | 1.848517e−22 | 3.507973e−21 | −8.862178e−25 | −3.871456e−26 | 4.835743e−29 |
| C6 | −9.813899e−28 | −8.222149e−27 | 3.205808e−26 | 1.726247e−29 | 3.672792e−30 | −1.092461e−33 |

| SRF | 23 | 26 | 29 | 34 | 38 | 40 |
|---|---|---|---|---|---|---|
| K  | 0 | 0 | 0 | 0 | 0 | 0 |
| C1 | 5.116169e−07 | 3.252068e−07 | −2.515552e−08 | −1.130904e−08 | 2.336279e−08 | 1.464967e−07 |
| C2 | −7.631783e−11 | −4.649504e−11 | 1.947845e−13 | 2.463683e−13 | −1.224680e−12 | 1.974044e−12 |
| C3 | 1.115383e−14 | −2.574578e−15 | −1.814191e−17 | −1.101814e−17 | 1.869425e−16 | −4.637058e−16 |
| C4 | −1.308686e−18 | 1.022883e−18 | −1.328934e−21 | −2.972090e−22 | −1.001651e−20 | 1.216769e−19 |
| C5 | 1.177910e−22 | −9.907368e−23 | 1.639600e−25 | 1.942591e−26 | 3.399061e−25 | −1.544405e−23 |
| C6 | −3.908759e−27 | 3.745941e−27 | −5.808419e−30 | −2.321607e−31 | −4.264065e−30 | 7.169909e−28 |

The invention claimed is:

1. A system, comprising:
a plurality of optical elements arranged along an axis between a first plane and a second plane, the plurality of rigid optical elements comprising a first rigid lens having a concave surface, the first rigid lens being formed from a material having a refractive index $n_L$ at a wavelength $\lambda$, the system being configured to support a liquid adjacent the concave surface of the first rigid lens between the first rigid lens and the second plane,
wherein the system is a microlithography projection objective having a maximum image-side numerical aperture, NA, greater than 1 which during operation is configured to direct radiation at $\lambda$ from the first plane to the second plane and image an object positioned at the first plane to the second plane when a liquid having a refractive index $n_F$ at $\lambda$ is positioned adjacent the concave surface of the first rigid lens, where $n_F$ is greater than $n_L$.

2. The system of claim 1, wherein the concave surface of the first rigid lens is a spherical surface.

3. The system of claim 2, wherein the spherical surface is positioned a distance that is 80% to 110% of the radius of the spherical surface from the second plane or from another rigid optical element positioned between the first rigid lens and the second plane.

4. The system of claim 3, wherein the spherical surface is essentially hemispherical.

5. The system of claim 1, wherein during operation the liquid positioned adjacent the concave surface forms a liquid lens.

6. The system of claim 5, wherein the liquid lens is a plano-convex liquid lens.

7. The system of claim 5, wherein the liquid lens is the curved optical element closest to the second plane.

8. The system of claim 1, wherein the first lens is the closest rigid optical element to the second plane.

9. The system of claim 1, further comprising a rigid optical element having a planar surface positioned along the axis between the first lens and the second plane.

10. The system of claim 9, wherein the rigid optical element having the planar surface is a plane-parallel plate.

11. The system of claim 9, wherein the microlithography projection objective is configured so that during operation a liquid is positioned between the rigid optical element having the planar surface and the second plane.

12. The system of claim 9, wherein the rigid optical element having a planar surface is formed from sapphire.

13. The system of claim 9, wherein the rigid optical element having the planar surface has a refractive index $n_{EP}$ at $\lambda$, where $n_F < n_{EP}$.

14. The system of claim 9, wherein during operation the liquid positioned adjacent the concave surface of the first lens fills a space along the axis between the first lens and the planar surface.

15. The system of claim 1, wherein $n_F > 1.4$.

16. The system of claim 1, wherein the first lens is a meniscus lens.

17. The system of claim 1, wherein the rigid optical element closest to the second plane is formed from a material selected from the group consisting of fused silica, $CaF_2$, $BaF_2$, $SrF_2$, LiF, and NaF.

18. The system of claim 17, wherein the first rigid lens is the rigid optical element closest to the second plane.

19. The system of claim 1, wherein the microlithography projection objective is a catadioptric projection objective.

20. The system of claim 1, wherein the microlithography projection objective forms at least one intermediate image of the object between the first plane and the second plane during operation of the system.

21. The system of claim 20, wherein the microlithography projection objective forms exactly two intermediate images of the object between the first plane and the second plane during operation of the system.

22. The system of claim 1, wherein the axis is a straight optical axis.

23. The system of claim 1, wherein the axis is a folded optical axis.

24. The system of claim 1, wherein NA is 1.4 or greater.

25. The system of claim 1, wherein $n_L < NA < n_F$.

26. The system of claim 1, wherein all rigid optical elements other than the first rigid optical element in the plurality of rigid optical elements have a refractive index equal to or less than $n_L$.

* * * * *

UNITED STATES PATENT AND TRADEMARK OFFICE
CERTIFICATE OF CORRECTION

PATENT NO. : 7,428,105 B2  
APPLICATION NO. : 11/758363  
DATED : September 23, 2008  
INVENTOR(S) : Shafer et al.

Page 1 of 1

It is certified that error appears in the above-identified patent and that said Letters Patent is hereby corrected as shown below:

On face page, in field (54), in column 1, in "Title", line 1, delete "OBJECTIVES" and insert -- OBJECTIVE --, therefor.

In column 1, line 1, delete "OBJECTIVES" and insert -- OBJECTIVE --, therefor.

In column 1, line 8–19, delete "This application..........their entirety" and insert the same as a new paragraph on line 4, below the "Title".

In column 4, line 59, delete "FIG." and insert -- FIGS. --, therefor.

In column 4, line 65, delete "FIG." and insert -- FIGS. --, therefor.

In column 5, line 25, delete "FIG." and insert -- FIGS. --, therefor.

In column 5, line 56, delete "FIG." and insert -- FIGS. --, therefor.

In column 7, line 13, delete "FIG." and insert -- FIGS. --, therefor.

In column 7, line 16, delete "FIG." and insert -- FIGS. --, therefor.

In column 8, line 10–13, delete "The sine of..........below 0.45." and insert the same as a new paragraph on col. 8 line 14.

In column 9–10, in Table 1b, line 1, delete "ONSTANTS" and insert -- CONSTANTS --, therefor.

Signed and Sealed this

Twenty-fifth Day of November, 2008

JON W. DUDAS  
*Director of the United States Patent and Trademark Office*